United States Patent
Saito et al.

(10) Patent No.: US 7,166,920 B2
(45) Date of Patent: Jan. 23, 2007

(54) ELECTRONIC COMPONENT, MOUNTED STRUCTURE, ELECTRO-OPTICAL DEVICE, AND ELECTRONIC DEVICE

(75) Inventors: Atsushi Saito, Nagano (JP); Shuichi Tanaka, Nagano (JP)

(73) Assignee: Seiko Epson Corporation (JP)

( * ) Notice: Subject to any disclaimer, the term of this patent is extended or adjusted under 35 U.S.C. 154(b) by 4 days.

(21) Appl. No.: 11/103,412

(22) Filed: Apr. 11, 2005

(65) Prior Publication Data

US 2005/0230773 A1    Oct. 20, 2005

(30) Foreign Application Priority Data

Apr. 16, 2004    (JP)    ............. 2004-121645

(51) Int. Cl.
*H01L 23/48*    (2006.01)
(52) U.S. Cl. ............ 257/738; 257/737; 257/780; 257/781; 257/E23.02; 257/E23.021
(58) Field of Classification Search .......... None
See application file for complete search history.

(56) References Cited

U.S. PATENT DOCUMENTS

| 5,668,410 | A |   | 9/1997 | Yamamoto |
| 5,707,902 | A | * | 1/1998 | Chang et al. ............ 438/614 |
| 5,877,556 | A |   | 3/1999 | Jeng et al. |
| 6,084,301 | A |   | 7/2000 | Chang et al. |
| 6,891,314 | B1 | * | 5/2005 | Sato et al. ............ 310/328 |
| 2002/0070463 | A1 | * | 6/2002 | Chang et al. ............ 257/780 |
| 2002/0089058 | A1 |   | 7/2002 | Hedler et al. |

FOREIGN PATENT DOCUMENTS

| JP | 02-007435 | 1/1990 |
| JP | 2-272737 | 11/1990 |
| JP | 02-272737 | 11/1990 |
| JP | 5-251455 | 9/1993 |
| JP | 11-233545 | 8/1999 |
| JP | 2001-110831 | 4/2001 |
| JP | 2003-068777 | 3/2003 |
| JP | 2004-186333 | 7/2004 |

OTHER PUBLICATIONS

Communication from European Patent Office regarding related application.

* cited by examiner

*Primary Examiner*—Jasmine Clark
(74) *Attorney, Agent, or Firm*—Harness, Dickey & Pierce, P.L.C.

(57) ABSTRACT

An electronic component electrically connected to a counter substrate through a pad on an active surface, characterized in that a resin bump on the active surface and an electrically conductive film on the resin bump constitute a bump electrode, and that a plurality of bump electrodes are electrically connected to the one pad.

12 Claims, 7 Drawing Sheets

ELECTRONIC COMPONENT, MOUNTED STRUCTURE, ELECTRO-OPTICAL DEVICE, AND ELECTRONIC DEVICE

RELATED APPLICATIONS

This application claims priority to Japanese Patent Application No. 2004-121645 filed Apr. 16, 2004 which is hereby expressly incorporated by reference herein in its entirety.

BACKGROUND

1. Technical Field

The present invention relates to an electronic component, a mounted structure, an electro-optical device, and an electronic device.

2. Related Art

Conventionally, technologies for packaging an electronic component, such as a semiconductor integrated circuit (IC), have been used in circuit boards or liquid crystal displays to be mounted on various electronic devices. For example, an IC chip for driving a liquid crystal panel is mounted on a liquid crystal display. The IC chip may be mounted directly on a glass substrate constituting the liquid crystal panel, or may be mounted on a flexible printed circuit (FPC) to be mounted in the liquid crystal panel. The mounted structure of the former is designated as a chip-on-glass (COG) structure, and that of the latter is designated as a chip-on-FPC (COF) structure.

As shown in FIG. 9(a), in a mounting process of the IC chip for driving the liquid crystal in the COG liquid crystal display, an IC chip 21 is placed on anisotropic conductive film (ACF) 222, which contains electrically conductive particles 222a dispersed in a thermosetting resin 222b, on a glass substrate 11. Upon heating and pressing of the IC chip 21 and the glass substrate 11, bump electrodes 21B and 21B on the IC chip 21 come into electrical contact with the arrays of electrode terminals 11bx and 11dx with the electrically conductive particles 222a therebetween. Then, the thermosetting resin 222b is cured to maintain the electrically conductive contact.

Typically, to ensure a highly reliable electrical connection between the metallic bump electrodes 21B and the electrode terminals 11bx and 11dx, the relative position between the IC chip 21 and the glass substrate 11 must be fixed while the electrically conductive particles 222a between them are elastically deformed. Thus, the electrically conductive contact through the electrically conductive particles 222a is maintained even when the thermosetting resin 222b thermally expands with temperature variations.

However, since the electrically conductive particles 222a are very small, it is very difficult to achieve the predetermined elastic deformation.

To solve this problem, as shown in FIG. 9(b), an invention in which a bump electrode 10 is composed of a resin bump 12 on an active surface of the IC chip 21 and an electrically conductive film 20 on the resin bump 12 has been proposed (see, for example, Japanese Unexamined Patent Application Publication No. 2-272737). Furthermore, an insulating film 26 is preformed on a pad 24 on the IC chip 21, and a part of the insulating film 26 is bored to form a connector 22 on the pad 24. Then, the electrically conductive film 20 of the bump electrode 10 extends to the connector 22, and thereby the bump electrode 10 can function as an electrode terminal of the IC chip 21.

When this bump electrode 10 is pressed against the terminal on the glass substrate, the resin bump 12 of the bump electrode 10 deforms elastically. Since the resin bump 12 of the bump electrode 10 is much larger than the electrically conductive particles in the ACF, a predetermined elastic deformation can be achieved. Under such a condition, after the IC chip 21 is fixed on the glass substrate using a thermosetting resin, the electrically conductive contact through the bump electrode 10 can be maintained even when the thermosetting resin thermally expands with temperature variations.

However, when the electrically conductive metallic film 20 is formed on the resin bump 12, the adhesion of the electrically conductive metallic film 20 is poorer than the adhesion of the electrically conductive metallic film on a metallic member. If the electrically conductive metallic film 20 detaches from the resin bump 12, the electrical connection between the bump electrode 10 and the electrode terminal on the glass substrate may be broken.

Furthermore, since the connector 22 is an opening in the insulating film 26 on the pad 24, a residual insulating film on the connector 22 may break the electrical connection between the bump electrode 10 and the pad 24.

Thus, under these defective conditions, the IC chip 21 may be electrically disconnected from the glass substrate. Accordingly, it would be desirable to increase the reliability of the electrical connection by improving the redundancy of the connection between the IC chip and the glass substrate.

The present invention was accomplished to solve the above-mentioned problems. It is an object of the present invention to provide an electronic component with excellent redundancy and a structure including the electronic component.

It is another object of the present invention to provide an electro-optical device and an electronic device both having a highly reliable electrical connection.

SUMMARY

To achieve the objects described above, the electronic component according to the present invention comprises a pad on an active surface, at least one resin bump on a protective coating over the pad, and at least one electrically conductive film on the at least one resin bump, the at least one electrically conductive film having at least one electrical connector to the pad, whereby the electronic component is electrically connected to a counter substrate through the at least one electrically conductive film, and is characterized in that the one pad is provided with a plurality of the resin bumps.

With this structure, even if the electrically conductive film on one of the plurality of resin bumps is detached, another electrically conductive film electrically connected to the same pad ensures the electrical connection to an electrode terminal on the counter substrate. Thus, an electronic component with excellent redundancy can be provided.

Another electronic component according to the present invention comprises a pad on an active surface, at least one resin bump on a protective coating over the pad, and at least one electrically conductive film on the at least one resin bump, the at least one electrically conductive film having at least one electrical connector to the pad, whereby the electronic component is electrically connected to a counter substrate through the at least one electrically conductive film, and is characterized in that the one pad is provided with a plurality of the electrical connectors.

With this structure, even if one of the plurality of electrical connectors is electrically disconnected, another electrical connector ensures the electrical connection between the electrically conductive film and the pad. Thus, an electronic component with excellent redundancy can be provided.

Another electronic component according to the present invention comprises a pad on an active surface, at least one resin bump on a protective coating over the pad, and at least one electrically conductive film on the at least one resin bump, the at least one electrically conductive film having at least one electrical connector to the pad, whereby the electronic component is electrically connected to a counter substrate through the at least one electrically conductive film, and is characterized in that the one pad is provided with a plurality of the resin bumps and the electrically conductive film having a plurality of the electrical connectors.

Preferably, the electronic component according to the present invention comprises a pad on an active surface, at least one resin bump on a protective coating over the pad, and at least one electrically conductive film on the at least one resin bump, the at least one electrically conductive film having at least one electrical connector to the pad, whereby the electronic component is electrically connected to a counter substrate through the at least one electrically conductive film, and is characterized in that the one pad is provided with a plurality of the resin bumps and a plurality of the electrically conductive films, each of the plurality of the electrically conductive films having a plurality of electrical connectors.

With this structure, even if one of the plurality of electrical connectors is electrically disconnected, another electrical connector ensures the electrical connection between the electrically conductive film and the pad. Furthermore, even if the electrically conductive film on one of the plurality of resin bumps is detached, another electrically conductive film electrically connected to the same pad ensures the electrical connection to the electrode terminal on the counter substrate. In addition, the detachment of one electrically conductive film on one resin bump does not induce the detachment of another electrically conductive film on another resin bump. Thus, an electronic component with excellent redundancy can be provided.

Preferably, the at least one resin bump is formed in a linear convex strip.

Preferably, each of the at least one resin bump is formed in a linear convex strip and is separately disposed within each of the plurality of electrically conductive film regions.

With this structure, the resin bump having a predetermined height can be accurately formed and thereby an electric device with excellent electrical connectivity can be provided. Furthermore, this allows a sealing resin to flow when the electric device is mounted on the counter substrate.

Preferably, the resin bump has a hemispherical shape.

With this structure, the resin bump can be elastically deformed with a small force to thus prevent the breakage of the electric device.

In a mounted structure according to the present invention in which an electronic component is mounted on a counter substrate, the electronic component comprises a pad on an active surface, at least one resin bump on a protective coating over the pad, and at least one electrically conductive film on the at least one resin bump, the at least one electrically conductive film having at least one electrical connector to the pad, and is characterized in that the at least one electrically conductive film electrically connected to the one pad is electrically connected to one electrical terminal of the counter substrate.

With this structure, even if one of the plurality of resin bumps is electrically disconnected from the electrical terminal on the counter substrate, another resin bump can be electrically connected to the electrical terminal on the counter substrate. Thus, an electronic component with excellent redundancy can be provided.

An electro-optical device according to the present invention is characterized in that the electronic component described above is mounted on a substrate and/or a circuit board constituting an electro-optical panel.

Since the electronic component has excellent redundancy, an electro-optical device with highly reliable electrical connectivity can be provided.

An electric device according to the present invention is characterized in that it includes the electro-optical device described above.

With this structure, an electronic device with highly reliable electrical connectivity can be provided.

DETAILED DESCRIPTION

Some embodiments according to the present invention will be described below with reference to the attached drawings. In each figure referred in the following explanation, each member is arbitrarily scaled for the sake of clarity.

Embodiment 1

A first embodiment according to the present invention will now be explained.

Figure 1:
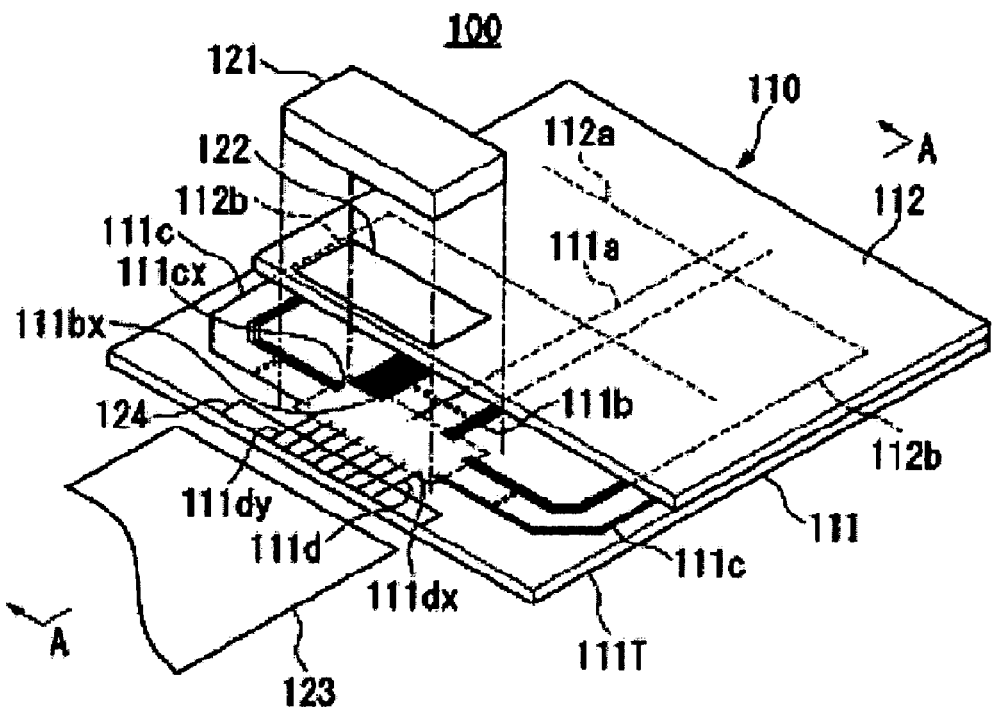
FIG. 1 is a schematic diagram showing a liquid crystal display.

FIG. 1 is a schematic diagram of a liquid crystal display according to one embodiment of the electro-optical device of the present invention. A liquid crystal display 100 includes a liquid crystal panel 110 and an electronic component (IC chip for driving a liquid crystal) 121. In addition, accessories, such as a polarizer, a reflection sheet, and a backlight, are included as necessary (not shown).

Electro-optical Device

The liquid crystal panel 110 includes substrates 111 and 112 made of glass or plastic. The substrate 111 and the substrate 112 are opposed to each other and are laminated with a sealant (not shown). A liquid crystal is contained between the substrate 111 and the substrate 112 as electro-optic material (not shown). An electrode 111a made of a transparent electric conductor, such as indium tin oxide (ITO), is disposed on the inner surface of the substrate 111. An electrode 112a is disposed on the inner surface of the substrate 112, opposed to the electrode 111a. The electrode 111a and the electrode 112a are orthogonal to each other. The electrode 111a and the electrode 112a extend to an overhang of the substrate 111T. An electrode terminal 111bx and an electrode terminal 111cx are disposed at the ends of the electrode 111a and the electrode 112a, respectively. An input circuit 111d is formed in the vicinity of the end of the overhang of the substrate 111T. A terminal 111dx is disposed at the inner end of the input circuit 111d.

An electronic component 121 is mounted on a sealing resin 122, which is composed of an uncured (A-stage) or a half-cured (B-stage) thermosetting resin, on the overhang of the substrate 111T. This electronic component 121 is, for example, an IC chip for driving a liquid crystal panel 110. The electronic component 121 has many bumps (not shown) on the bottom surface. These bumps are electrically connected to the terminals 111bx, 111cx, and 111dx on the overhang of the substrate 111T.

A flexible circuit board 123 is mounted on an anisotropic conductive film 124 on the input terminal 111dy at the outer end of the input circuit 111d. The input terminal 111dy is electrically connected to a corresponding circuit on the flexible circuit board 123 (not shown). A control signal, a video signal, and an electric potential of a power source are sent from outside sources to the input terminal 111dy via the flexible circuit board 123. Then, a signal for driving the liquid crystal is generated by the electronic component 121 and is sent to the liquid crystal panel 110.

In the liquid crystal display 100 according to this embodiment, a voltage applied between the electrode 111a and the electrode 112a via the electronic component 121 reorients the liquid crystal of a picture element at which the electrode 111a and the electrode 112a are oppositely placed. This modulates light and forms a desired image in a display area, which is an array of the picture elements, in the liquid crystal panel 110.

Figure 2:
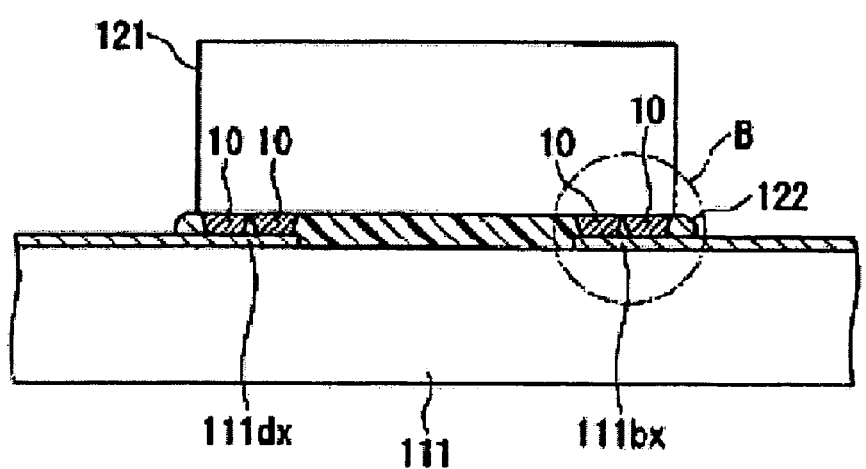
FIG. 2 is an explanatory drawing of a mounted structure of an electronic component in a liquid crystal display.

FIG. 2 is a sectional side view taken along the A—A line of FIG. 1, showing the mounted structure of the electronic component 121 in the liquid crystal display 100. The active surface (the bottom surface in FIG. 2) of the electronic component 121 has a plurality of bump electrodes 10 as terminals of the IC chip. The tips of the bump electrodes 10 are directly in electrical contact with the terminals 111bx and 111dx on the substrate 111. The periphery of the electrically conductive contact between the bump electrodes 10 and the terminals 111bx and 111dx is filled with a cured sealing resin 122 composed of a thermosetting resin and other materials.

Electronic Component

Figure 3:
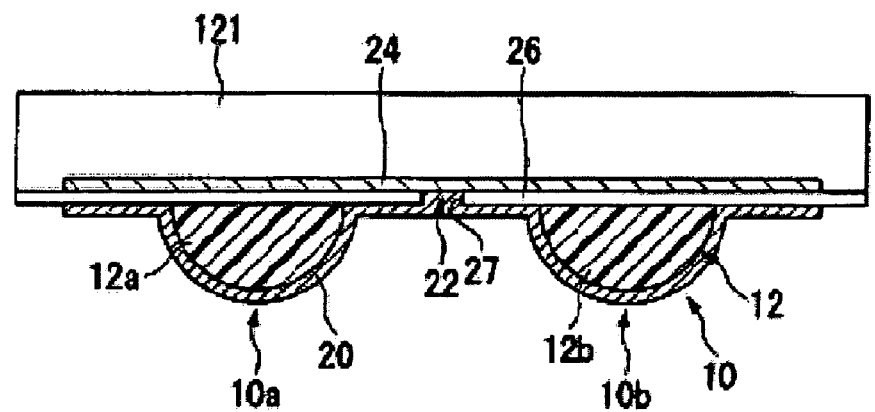
FIGS. 3(a) and 3(b) are explanatory drawings of a structure of electrodes in an electronic component according to a first embodiment.
Figure 3:
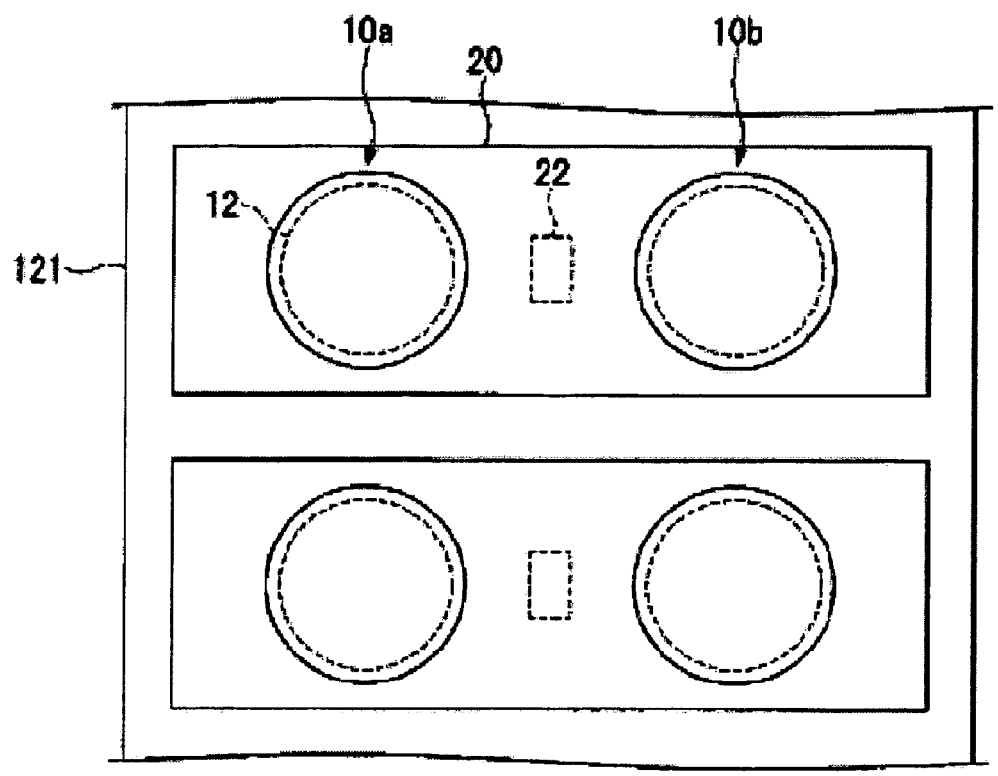

FIG. 3 shows the structure of the electrodes in the electronic component according to this embodiment. FIG. 3(a) is an enlarged view of a portion B in FIG. 2. FIG. 3(b) is a bottom view of the electronic component. An electronic component 121 is, for example, an integrated circuit chip having certain circuitry on a silicon substrate. A pad 24 made of, for example, aluminum is disposed on a surface (the bottom surface in FIG. 2(a)) of the electronic component 121. The pad 24 is arranged along the periphery of the electronic component 121. The pad 24 is covered with a protective coating 26, such as a passivation film made of insulating material like silicon nitride. An opening 27 in the protective coating 26 functions as an electrical connector 22 to the pad 24.

Resin bumps 12 are disposed on the protective coating 26. The resin bumps 12 are formed by applying elastic resin material, such as polyimide, on the protective coating 26 followed by patterning, including photolithography. The resin bumps 12 have a hemispherical shape after the photolithography using a gray mask. A plurality of resin bumps 12 are formed in the proximity of the connector 22 in this embodiment. In FIG. 3, resin bumps 12a and 12b are formed on opposite sides of the connector 22.

The resin bumps 12a and 12b are covered with an electrically conductive film 20. The electrically conductive film 20 may be formed by vapor deposition or sputtering of an electrically conductive metal, such as gold, copper, and nickel, followed by appropriate patterning. Furthermore, the electrical connectivity of the electrically conductive film composed of copper, nickel, or aluminum may be improved by plating it with gold.

In this way, hemispherical bump electrodes 10a and 10b composed of the resin bumps 12a and 12b and the electrically conductive film 20 are formed on the electronic component 121. The bump electrode may have the shape of a truncated cone, truncated pyramid, cylinder, or prism, instead of hemispherical. The bump electrode having such a shape may be formed by applying the electrically conductive film on the resin bump having a corresponding shape.

The electrically conductive film 20 extends from the resin bumps 12a and 12b to the electrical connector 22. This allows a plurality of the bump electrodes 10a and 10b to be electrically connected to the one pad 24.

Mounted Structure

Figure 4:
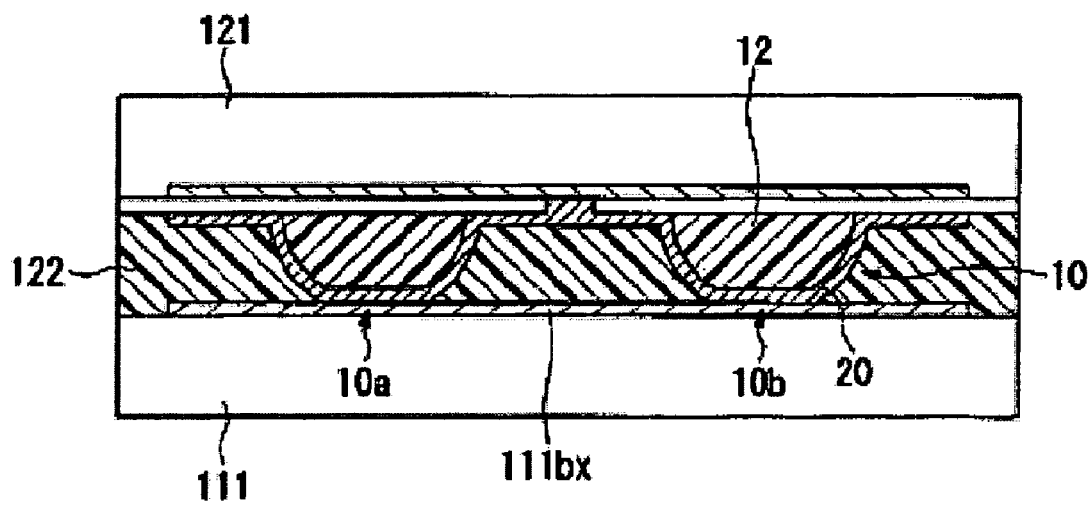
FIG. 4 is an explanatory drawing of a mounted structure of the electronic component according to the first embodiment.

FIG. 4 is an enlarged view of the portion B in FIG. 2, showing a mounted structure of the electronic component according to this embodiment. The electronic component 121 is mounted on the sealing resin 122 composed of the thermosetting resin on the substrate 111. The electronic component 121 is mounted by placing the sealing resin 122 in a film or sheet form on the substrate 111 and pressing the electronic component 121 against the substrate 111 while heating the substrate 111. During this process, the bump electrode 10 of the electronic component 121 proceeds while pushing the sealing resin 122 aside (the bump electrode 10 displaces the sealing resin 122) and comes into contact with the terminal 111bx on the substrate 111. Further pressing the electronic component elastically deforms the resin bumps 12. At this position, the sealing resin 122 is cured under continuous heating, and the relative position between the electronic component 121 and the substrate 111 is fixed. Thus, the resin bumps 12 are maintained in the elastically deformed state. This allows the electrically conductive contact between the bump electrode 10 and the terminal 111bx to be maintained even when the thermosetting resin 22b thermally expands with temperature variations, thus ensuring the electrical connection between the electronic component 121 and the substrate 111.

Since both the substrate 111 composed of glass or the like and the terminal 111bx composed of ITO or the like are transparent, the contact surface between the tip of the bump electrode 10 and the terminal 111bx can be seen from the back side of the substrate 111. The hemispherical bump electrode 10 comes into contact with the terminal 111bx, exhibiting the contact surface. The diameter of the contact surface increases in proportion to the elastic deformation of the bump electrode 10. Thus, the contact status between the bump electrode 10 and the terminal 111bx can be easily understood by observing the presence, the shape, or the width of the contact surface from the back side of the substrate 111.

However, when the electrically conductive metallic film 20 is formed on the resin bump 12, the adhesion of the electrically conductive metallic film 20 is less than the adhesion of the electrically conductive metallic film on a metallic member. If the electrically conductive metallic film 20 detaches from the resin bump 12, the electrical connection between the bump electrode 10 and the terminal 111*bx* may be broken.

To avoid this problem, as shown in FIG. 3, the electronic component according to this embodiment has a plurality of bump electrodes 10*a* and 10*b* electrically connected to the one pad 24. In addition, as shown in FIG. 4, the mounted structure according to this embodiment includes the bump electrodes 10*a* and 10*b* on the electronic component 121 electrically connected to the one terminal 111*bx* on the counter substrate 111. With this structure, even if the electrically conductive film 20 on one (for example, 10*a*) of the plurality of bump electrodes 10*a* and 10*b* shown in FIG. 3 is detached, another bump electrode (for example, 10*b*) electrically connected to the same pad 24 ensures the electrical connection to the terminal 111*bx* on the counter substrate 111 shown in FIG. 4. This ensures the electrical connection between the electronic component 121 and the counter substrate 111, providing an electronic component with excellent redundancy and a structure including the electronic component.

In addition, the plurality of bump electrodes 10*a* and 10*b* electrically connected to the one terminal 111*bx* on the counter substrate 111 can reduce the electrical resistance of the electrical connection.

Embodiment 2

A second embodiment of the present invention will be described below with reference to FIG. 5.

Figure 5:
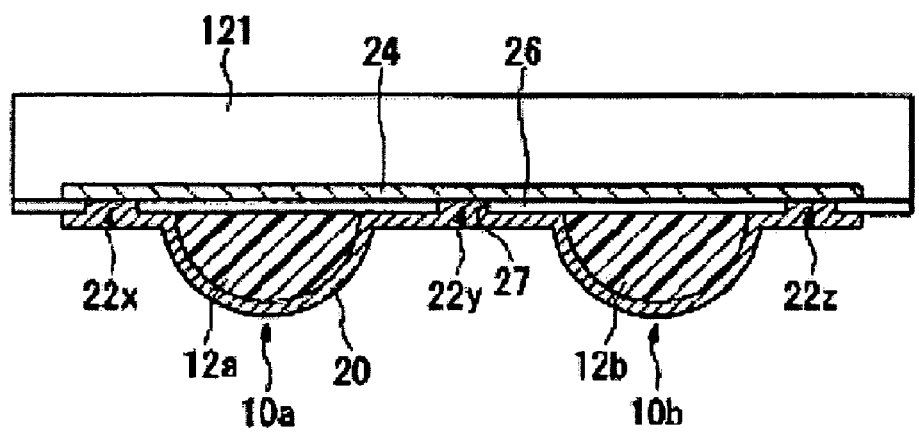
FIG. 5 is an explanatory drawing of a structure of electrodes in an electronic component according to a second embodiment.

FIG. 5 is an enlarged view of the portion B in FIG. 2, showing the structure of electrodes in an electronic component according to the second embodiment. The electronic component according to the second embodiment is different from that in the first embodiment in that one bump electrode (for example, 10*a*) is electrically connected to the pad 24 through a plurality of electrical connectors 22*x*, 22*y*, and 22*z*. Like components are denoted by like numerals in the first embodiment and will not be further explained.

The electronic component according to the second embodiment has a plurality of openings 27 in the protective coating 26 on the pad 24. These openings function as connectors 22*x*, 22*y*, and 22*z* on the pad 24.

Hemispherical resin bumps 12 are disposed on the protective coating 26. In FIG. 5, resin bumps 12*a* and 12*b* are disposed between the connector 22*x* and the connector 22*y* and between the connector 22*y* and the connector 22*z*, respectively.

All the resin bumps 12*a* and 12*b* are covered with one electrically conductive film 20. The resin bumps 12*a* and 12*b* and the electrically conductive film 20 constitute the bump electrodes 10*a* and 10*b*.

The electrically conductive film 20 extends from the resin bumps 12*a* and 12*b* to the electrical connectors 22*x*, 22*y*, and 22*z*. This allows the bump electrode 10*a* to be electrically connected to the pad 24 through the connectors 22*x*, 22*y*, and 22*z*. The bump electrode 10*b* is also electrically connected to the pad 24 through the connectors 22*x*, 22*y*, and 22*z*.

The connectors 22*x*, 22*y*, and 22*z* are formed by boring the protective coating of insulating material on the pad 24. Thus, if the protective coating remains on the connector, residual insulating material on the pad 24 may break the electrical connection between the pad 24 and the electrically conductive film 20 at the connector.

Hence, in the electronic component according to this embodiment, each of the bump electrodes 10*a* and 10*b* is electrically connected to the pad 24 through the connectors 22*x*, 22*y*, and 22*z*. With this structure, even if one (for example, 22*x*) of the plurality of connectors is electrically disconnected, the other electrical connectors (for example, 22*y* and 22*z*) ensure the electrical connection between the pad 24 and the bump electrodes 10*a* and 10*b*. Then, the bump electrodes 10*a* and 10*b* are electrically connected to a terminal of the counter substrate to electrically connect the electronic component 121 with the counter substrate. Thus, an electronic component with excellent redundancy and a structure including the electronic component can be provided.

Embodiment 3

A third embodiment of the present invention will be described below with reference to FIG. 6.

Figure 6:
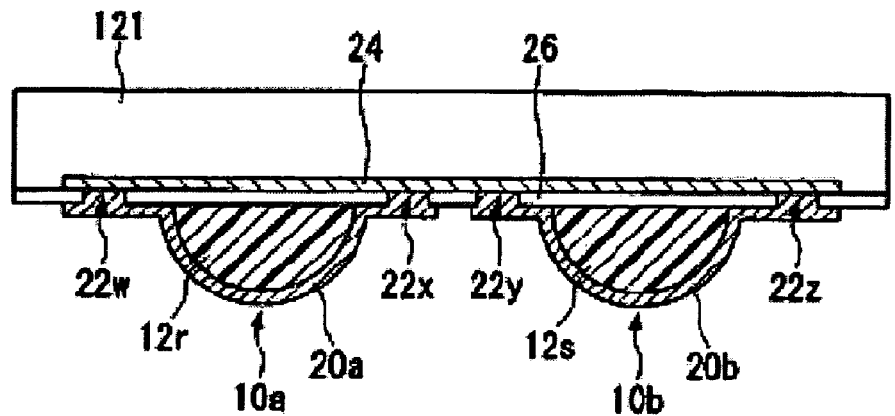
FIGS. 6(a) and 6(b) are explanatory drawings of a structure of electrodes in an electronic component according to a third embodiment.
Figure 6:
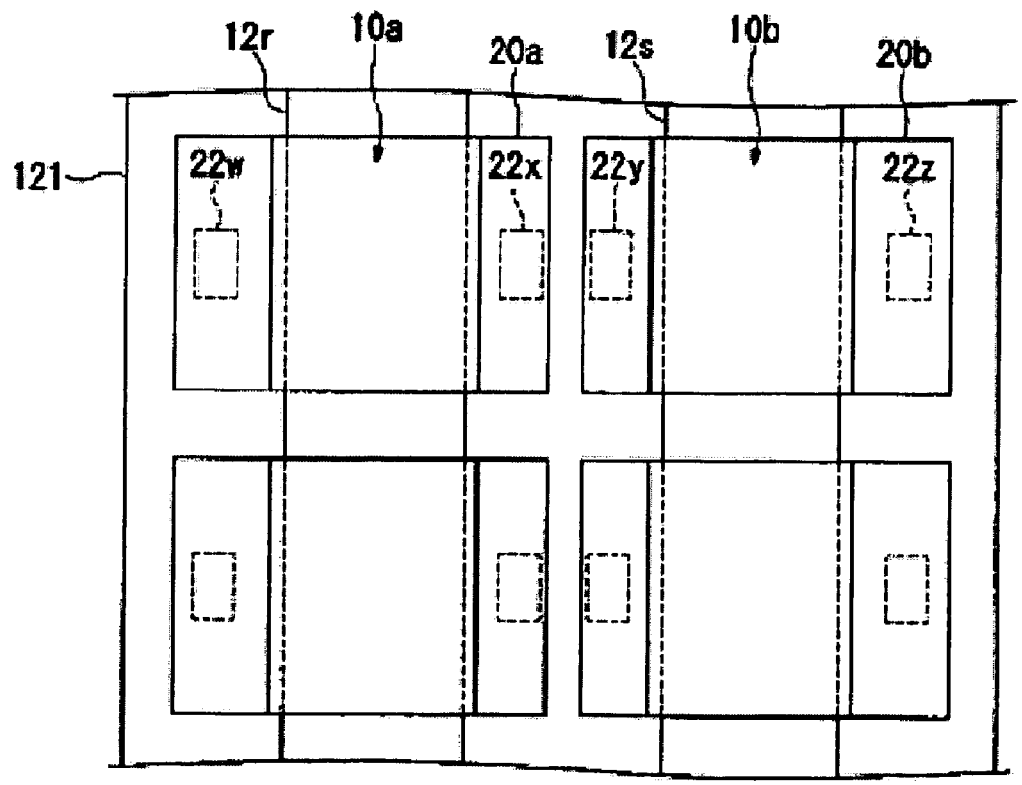

FIG. 6 shows the structure of electrodes in an electronic component according to the third embodiment. FIG. 6(*a*) is an enlarged view of the portion B in FIG. 2. FIG. 6(*b*) is a bottom view of the electronic component. The electronic component according to the third embodiment is different from those in the first and second embodiments in that resin bumps 12 (12*r* and 12*s*) are formed in linear convex strips and that a plurality of electrically conductive separate films (20*a* and 20*b*) are individually connected to the pad 24. Like components are denoted by like numerals in the first and second embodiments and will not be further explained.

In the electronic component according to the third embodiment, the resin bumps 12*r* and 12*s* are formed in linear convex strips in the direction along the pad 24. The transverse cross section of the resin bumps 12*r* and 12*s* is semicircular. Such a resin bump in a linear convex strip can be formed more accurately in height than the hemispherical resin bump. Thus, an electronic component with highly reliable electrical connectivity can be provided by using bump electrodes including the resin bumps 12*r* and 12*s* in linear convex strips.

Openings in the protective coating 26 are formed on opposite sides of the resin bumps 12*r* and 12*s*. These openings function as connectors 22*w*, 22*x*, 22*y*, and 22*z* to the pad 24.

In the electronic component according to the third embodiment, the electrically conductive film is separated into a plurality of electrically conductive films 20*a* and 20*b*. The electrically conductive films are disposed on the resin bumps 12*r* and 12*s*. These resin bumps 12*r* and 12*s* and the electrically conductive films 20*a* and 20*b* constitute bump electrodes 10*a* and 10*b*.

The electrically conductive films 20*a* and 20*b* extend from the resin bumps 12*r* and 12*s* to the connectors 22*w*, 22*x*, 22*y*, and 22*z* disposed on the opposite sides of the resin bumps. This allows the one bump electrode 10*a* to be electrically connected to the pad 24 through the plurality of connectors 22*w* and 22*x*, as in the second embodiment. The one bump electrode 10*b* is also electrically connected to the pad 24 through the plurality of connectors 22*y* and 22*z*.

Then, the plurality of bump electrodes 10*a* and 10*b* in the electronic component 121 are electrically connected to the one terminal 111*bx* on the counter substrate 111 (see FIG. 4).

However, since the adhesion between the electrically conductive metallic film 20 and the resin bump 12 is poor, as described in the first embodiment, the electrically conductive metallic film 20 may detach from the resin bump 12. To avoid this problem, the electronic component according to the third embodiment is provided with a plurality of the electrically conductive separate films 20*a* and 20*b* on the resin bumps 12*r* and 12*s*. In addition, the plurality of bump electrodes 10*a* and 10*b* in the electronic component are electrically connected to the one terminal 111*bx* on the counter substrate 111 (see FIG. 4). With this structure, even if one electrically conductive film (for example, 20*a*)

detaches from the resin bump, another electrically conductive film (for example, 20b) electrically connected to the same pad 24 ensures the electrical connection with the terminal on the counter substrate. This ensures the electrical connection between the electronic component and the counter substrate, providing an electronic component with excellent redundancy and a structure including the electronic component.

As described in the second embodiment, residual insulating material in the connector on the pad 24 may break the electrical connection between the pad 24 and the electrically conductive film 20 at the connector. Hence, in the electronic component according to the third embodiment, each of the bump electrodes (for example, 10a) is electrically connected to the pad 24 through the plurality of connectors (for example, 22w and 22x). With this structure, even if one (for example, 22w) of the plurality of connectors is electrically disconnected, another connector (for example, 22x) ensures the electrical connection between the pad 24 and the bump electrode (10a). Then, the bump electrode (10a) is electrically connected to the terminal of the counter substrate to electrically connect the electronic component with the counter substrate. Thus, an electronic component with excellent redundancy and a structure including the electronic component can be provided.

Figure 7:
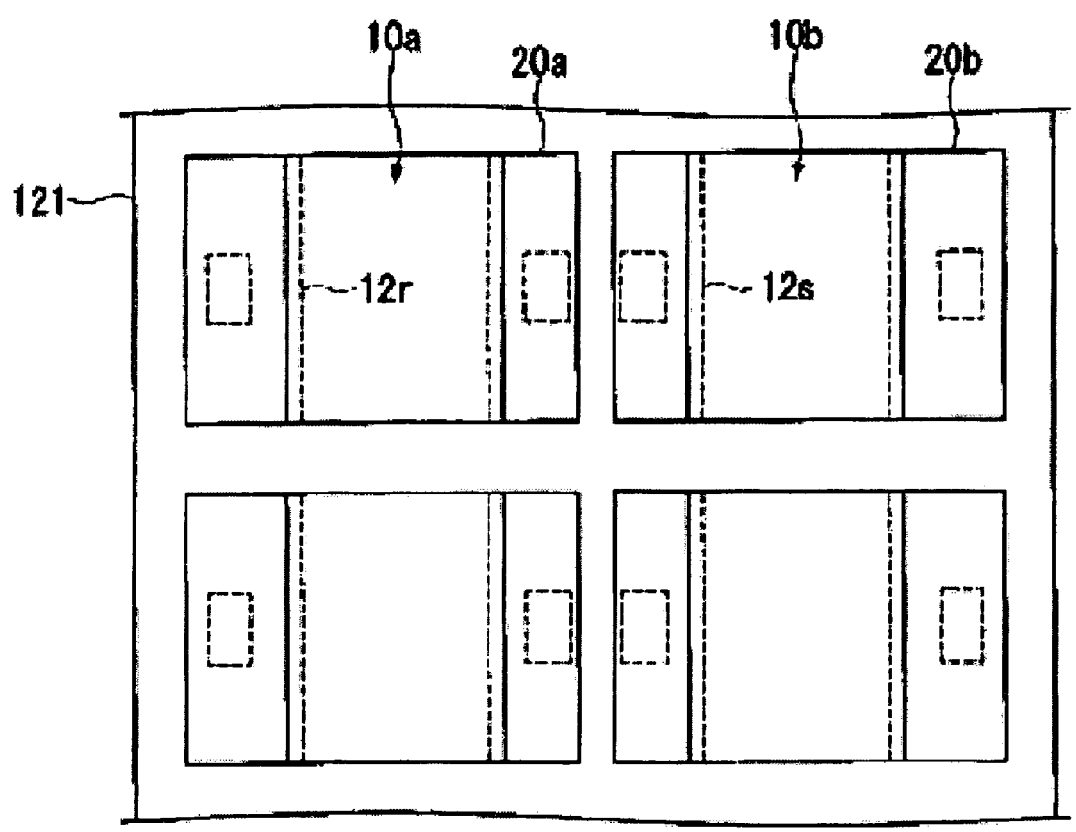
FIG. 7 is an explanatory drawing of a variation of the electronic component according to the third embodiment.

In the third embodiment shown in FIG. 6, the resin bumps 12r and 12s are formed in linear convex strips in the direction along the pad 24. On the other hand, as shown in FIG. 7, the resin bumps 12r and 12s may be separated by removing a part of the resin bumps 12r and 12s where no electrically conductive film is present. Specifically, as described in the third embodiment, the resin bumps 12r and 12s are first formed in linear convex strips. Then, the electrically conductive films 20a and 20b are formed on the resin bumps 12r and 12s. Then, plasma etching is performed using oxygen as a processing gas. Since the electrically conductive films 20a and 20b made of metallic material are more resistant to dry etching than resin material, a part of the resin bumps 12r and 12s where the electrically conductive films 20a and 20b are not formed can be selectively removed.

As shown in FIG. 4, the electronic component 121 is mounted on the sealing resin 122 composed of a thermosetting resin on the substrate 111. Thus, when a part of the resin bump in a linear convex strip is previously removed, the sealing resin 122 can flow easily along the part. Thus, the electronic component 121 can be reliably mounted on the counter substrate 111.

Electronic Device

Figure 8:
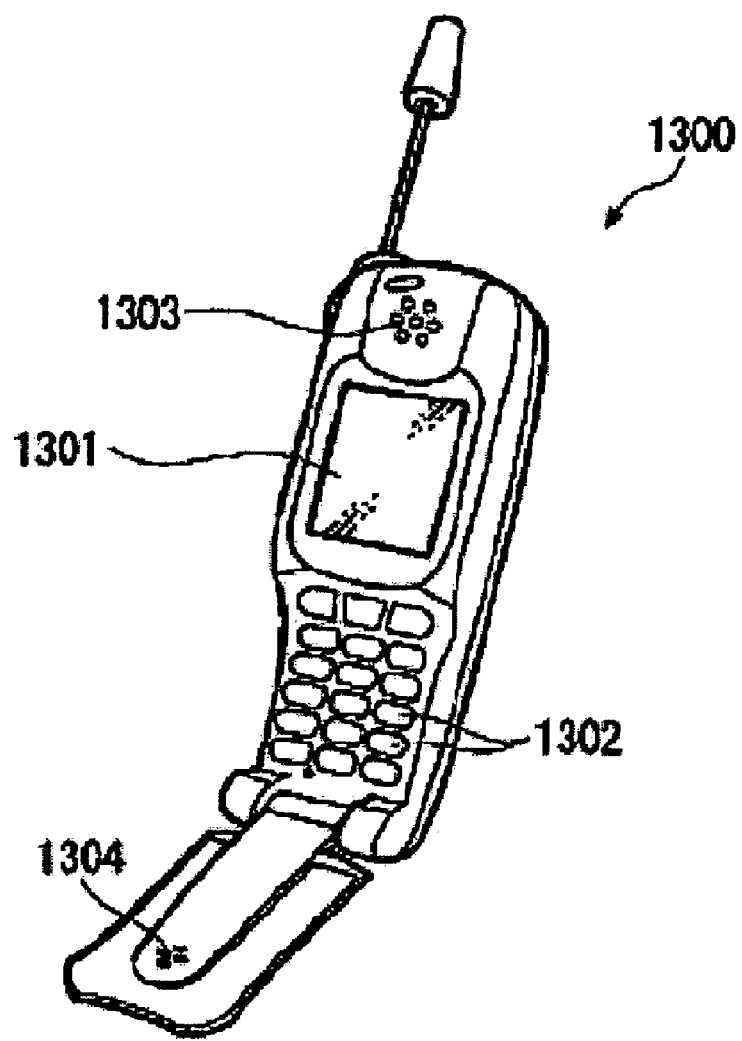
FIG. 8 is a perspective view of a mobile phone.
Figure 9:
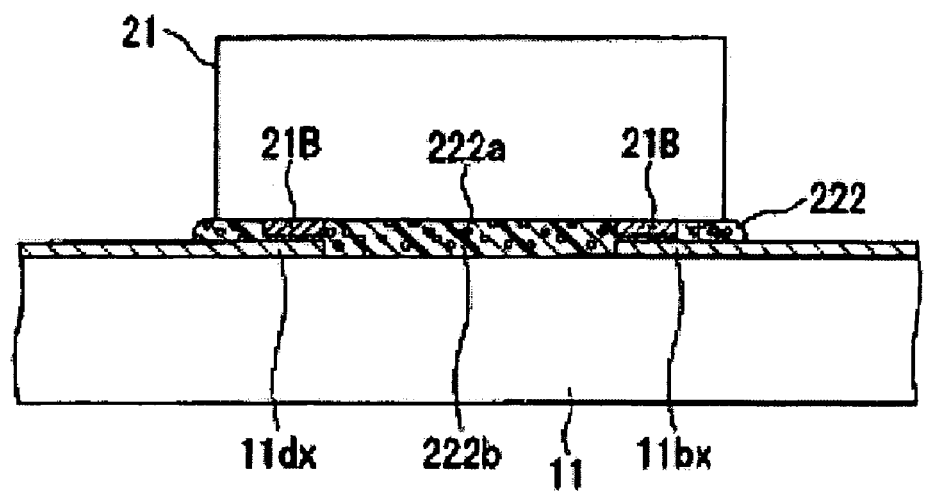
FIGS. 9(a) and 9(b) are explanatory drawings of a mounted structure of a conventional electronic component.
Figure 9:
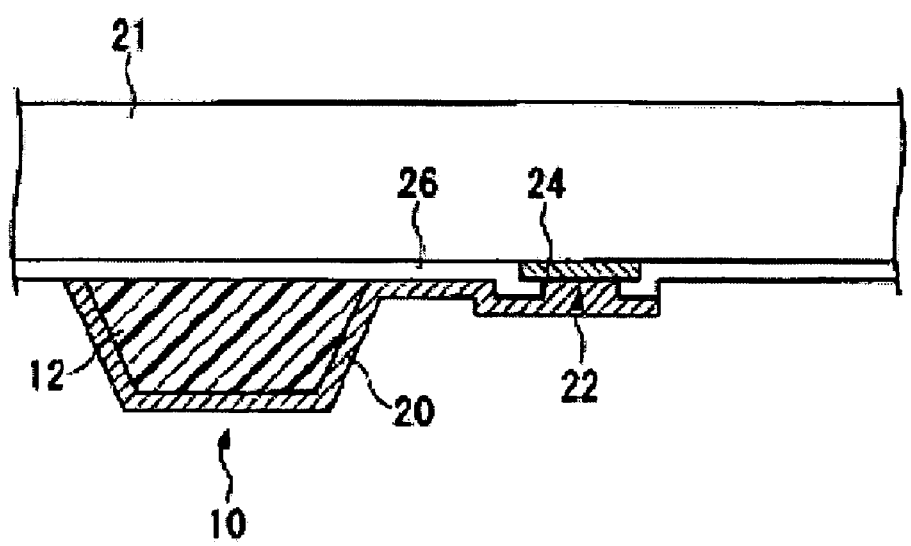

FIG. 8 is a perspective view of an electronic device according to one embodiment of the present invention. A mobile phone 1300 in this figure is provided with a small-size display 1301, which is the electro-optical device described above, a plurality of operation buttons 1302, an earpiece 1303, and a mouthpiece 1304.

The electro-optical device described above can be suitably used as an image display in electronic books, personal computers, digital still cameras, liquid crystal televisions, video recorders with a viewfinder or a direct-viewfinder, car navigation systems, pagers, electronic notepads, electronic calculators, word processors, workstations, videophones, POS terminals, and devices with a touch panel, in addition to the mobile phone. In any case, electric devices having a highly reliable electrical connection can be provided.

The technical scope of the present invention is not limited to the embodiments described above and covers various changes and modifications of the embodiments without departing from the gist of the present invention. In other words, the specific materials or structures described in the embodiments are offered by way of illustration, and various changes and modifications can be made.

What is claimed is:

1. An electronic component adapted for connection with a counter substrate, the electric component comprising:
    an active surface;
    a pad on the active surface;
    a protective coating on the pad;
    a plurality of resin bumps on the protective coating, the plurality of resin bumps being provided for the pad; and
    at least one conductive film disposed on at least one of the resin bumps and in at least a region defined between the resin bumps, the conductive film having at least one electrical connector electrically connected to the pad, and the conductive film being electrically connected to the counter substrate,
    wherein the protective coating is disposed between the pad and the conductive film in at least the region defined between the resin bumps.

2. The electronic component according to claim 1, wherein each of the plurality of resin bumps is formed as a linear convex strip and is separately disposed within each of a plurality of electrically conductive film regions.

3. An electro-optical device including the electronic component according to claim 1 mounted on at least one of a substrate and a circuit board constituting an electro-optical panel.

4. An electronic device comprising:
    an electro-optical device according to claim 3.

5. The electronic component according to claim 1, wherein each of the plurality of resin bumps is formed as a linear convex strip.

6. The electronic component according to claim 5, wherein each of the plurality of resin bumps has a hemispherical shape.

7. An electronic component adapted for connection with a counter substrate, the electric component comprising:
    an active surface;
    a pad on the active surface;
    a protective coating on the pad;
    a plurality of resin bumps on the protective coating, the plurality of resin bumps being provided for the pad; and
    at least one conductive film on at least one of the resin bumps, the conductive film having at least one electrical connector electrically connected to the pad, and the conductive film being electrically connected to the counter substrate,
    wherein the conductive film has a plurality of the electrical connectors.

8. An electronic component adapted for connection with a counter substrate, the electric component comprising:
    an active surface;
    a pad on the active surface;
    a protective coating on the pad;
    a plurality of resin bumps on the protective coating, the plurality of resin bumps being provided for the pad; and
    at least one conductive film on at least one of the resin bumps, the conductive film having at least one electrical connector electrically connected to the pad, and the conductive film being electrically connected to the counter substrate,
    wherein a plurality of the conductive films is provided for the pad, and each of the plurality of conductive films has a plurality of electrical connectors.

9. An electronic component adapted for connection with a counter substrate, the electric component comprising:
- an active surface;
- a pad on the active surface;
- a protective coating on the pad;
- at least one resin bump on the protective coating; and
- at least one conductive film on the at least one resin bump, the conductive film having a plurality of electrical connectors electrically connected to the pad, and the conductive film being electrically connected to the counter substrate.

10. The electronic component according to claim 9, wherein the at least one resin bump is formed as a linear convex strip.

11. The electronic component according to claim 10, wherein the at least one resin bump has a hemispherical shape.

12. A mounted structure comprising:
- a counter substrate; and
- an electric component including:
  - an active surface;
  - a pad on the active surface;
  - a protective coating on the pad;
  - a plurality of resin bumps on the protective coating, the plurality of resin bumps being provided for the pad; and
- at least one conductive film disposed on at least one of the resin bumps and in at least a region defined between the resin bumps, the conductive film having at least one electrical connector electrically connected to the pad, and the conductive film being electrically connected to one electrical terminal of the counter substrate,
- wherein the protective coating is disposed between the pad and the conductive film in at least the region defined between the resin bumps.

* * * * *